United States Patent [19]
Reinberg et al.

[11] 4,069,096
[45] Jan. 17, 1978

[54] SILICON ETCHING PROCESS
[75] Inventors: Alan R. Reinberg, Dallas; Raman K. Rao, Houston, both of Tex.
[73] Assignee: Texas Instruments Incorporated, Dallas, Tex.
[21] Appl. No.: 628,184
[22] Filed: Nov. 3, 1975
[51] Int. Cl.² .......................................... H01L 21/306
[52] U.S. Cl. ................................. 156/643; 156/646; 156/657; 156/659; 204/192 E; 252/79.1
[58] Field of Search .................. 156/8, 17, 643, 646, 156/652, 653, 657, 659, 662; 427/88; 252/79.1; 204/164, 170, 129.1, 129.65, 192 EC, 192 E; 29/580; 96/36.2, 38.3, 38.4

[56] References Cited
U.S. PATENT DOCUMENTS

| 3,615,956 | 10/1971 | Irving et al. | 156/17 |
| 3,743,847 | 7/1973 | Boland | 96/36.2 X |
| 3,923,568 | 12/1975 | Bersin | 156/8 |
| 3,951,709 | 4/1976 | Jacob | 156/8 |
| 3,975,252 | 8/1976 | Fraser | 204/192 |

Primary Examiner—William A. Powell
Attorney, Agent, or Firm—James T. Comfort; Gary C. Honeycutt

[57] ABSTRACT

In the manufacture of semiconductor devices it is often times necessary to use photomasks. It has been found that silicon material is useful as see-through photomasks when deposited on a thin film of glass. After deposition the silicon is etched to form the mask. A suitable etchant, which may be used and which does not undercut patterned material formed over the silicon, may be derived from a composition of $CCl_4 + N_2 + Cl_2$ and in some instances + HCl. This etchant may also be used in patterning polysilicon leads on various silicon devices such as charged coupled devices without undercutting of the leads.

11 Claims, No Drawings

SILICON ETCHING PROCESS

FIELD OF THE INVENTION

This invention relates generally to the processing of semiconductor materials and more particularly to a process and material useful in the manufacturing of semiconductor devices. Additionally the process is useful in the manufacture of photomasks made from silicon material wherein the mask is made by covering the silicon with an organic photo-resist material in a desired pattern and thereafter etching the silicon material to form a distinct mask pattern.

BACKGROUND OF THE INVENTION

In manufacturing of semiconductor devices, a slice of semiconductor material has applied on one of its surfaces a relatively thin layer of an insulating film. A layer of photo-resist material is then spun onto the insulating layer and is subsequently exposed to ultraviolet light through a mask having openings corresponding to those areas on this semiconductor slice where it is desired, for example, to generate semiconductor junctions. This application deals primarily with a process of etching silicon and the manufacturing of the mask through which exposure is made to the photo-resist material.

Silicon has been shown to be an excellent material for use as a see-through photomask layer when deposited as a thin film on glass. One method of depositing silicon currently in use is the chemical vapor deposition from silane or plasma promoted chemical vapor deposition. Another method of depositing silicon is by ordinary sputtering or evaporating using electron beam melting. In order to make a mask, the silicon material is deposited on a glass substrate, thereafter a portion of the silicon has to be removed to define the pattern of the mask.

To remove the silicon material, a photo-resist material may be applied there over and then portions thereof removed to form a particular pattern. Thereafter the silicon material in the exposed areas is also removed. The material can be removed by a number of processes, one of which is a plasma process utilizing halocarbon-oxygen gas mixtures such as those disclosed in U.S. Pat. 3,806,365. However, there are some disadvantages using a technique as described, such as physical degradation of the photo-resist etch mask and undercutting of the silicon material, both of which may impair the line/line resolution of the mask. Present silicon etch techniques use either acid wet etch or dry RF plasma etch using halocarbon mixtures disclosed in above U.S. Pat. No. 3,806,365 tend to produce nonuniform results in a manufacturing operation. Silicon lead dimensions are a critical factor in defining the electrical characteristics of a CCD or silicon gate device. Ability to define closely spaced geometries without significant reduction in lead width (undercut) is a key for high density MOS/LSI circuits.

A gas plasma vapor etching process is disclosed in U.S. Pat. No. 3,615,456 in which a gas containing chlorine is used, however the gas is used to detect pinholes, polish the surfaces of a semiconductor device or etch break lines.

Accordingly it is an object and feature of the present invention to provide an improved process utilizing materials that overcome the aforementioned problems and provide uniform etching without undercutting to provide an efficient process for removing the silicon material in forming silicon masks, connecting leads and semiconductor devices which utilize silicon and require the etching thereof. This technique is anticipated to have increased application in high density MOS/LSI such as 4K, 16K, 64K RAM techniques.

DESCRIPTION OF THE INVENTION

In accordance with the present invention silicon is deposited by evaporation for example, on a film of glass. It has been found that when the glass substrate temperature is in excess of 265° C a very good adhesion is obtained and the films are very scratch resistant. Films approximately 1,000 Angstroms thick, for example, are used for photomask blanks.

After the silicon material has been placed on the glass, it is necessary to pattern the silicon to form the mask in a particular configuration. The silicon film may be patterned using a photo-resist material. The photo-resist material is patterned and then removed over the areas of the silicon which are to be removed from the glass to form the mask. It has been common practice to use wet chemicals or plasma etch using fluoride derived from a halo carbon source such as $CF_4$ or $SF_6$ with or without the addition of oxygen. Both of these fluoride base etchants when activated in a plasma have the disadvantage of undercutting the photo-resist pattern if etching is continued beyond the time necessary to clear the exposed region.

The removal of a semiconductor material to form the mask may be accomplished through plasma etch in which the exposed silicon is subjected to a plasma generated by admission of an appropriate gas mixture in a reduced atmosphere and in a radio frequency field. A reactor suitable for carrying out the process of the present invention is described in U.S. Pat. No. 3,757,733.

It has been discovered that silicon etched in a plasma derived from a mixture of gases (chloro etch) including $CCl_4$ and an inert gas such as nitrogen or argon does not undercut masking materials such as photo-resist material, oxides and nitrides even for severe over etching. Furthermore it has been discovered that improved results occur when there is an addition of another chlorine material to the plasma such as $Cl_2$ or HCl.

One of the technical advances realized from the invention is the capability of etching uniformly a full susceptor load, typically 25 or more semiconductor slices or photomasks, at one time within a sufficiently wide process window. Prior art processes require operation at the very limit of the vacuum pump capacity and does not permit repeatable results. By adding $Cl_2$ or HCl to $CCl_4$ greater flexibility is achieved yielding an improved etch rate without any attendant problem of width dimensional control. An acceptable manufacturing process window is available through the chloro etch process.

It is believed the reason why the $CCl_4$ etchant does not undercut is because it acts via an ionic mechanism, whereas when an etchant such as $CF_4$ is used, a molecular or atomic reaction takes place. The ions do not have sufficient life time to get under the resist layer or are preferentially directed by the action of the electric fields producing the glow discharge.

In production of a photomask, silicon is deposited on a thin glass substrate, the photo-resist material is applied over the silicon and then patterned to expose those portions of the silicon which are to be removed in making the mask. Exposed silicon is then subjected to a chloro etch including $CCl_4 + N_2 + Cl_2$ for approximately sixteen minutes. This time is dependent upon exact thickness of the silicon layer to be etched. In order to ensure that there is no residue of silicon remaining on the surface after the etching, it may be subjected to a $CF_4 + O_2$ etch for one-half or less minute. This will ensure that all the silicon has been removed in the exposed areas. The time period should be kept as short as possible to ensure that there is no or minimum undercutting of the photo-resist material. Thereafter the photo-resist is removed and the mask is complete.

Table I is a chart showing the etch rate in Angstroms per minute of several different materials using variations of the etch of the present invention. It should be noted that silicon and undoped polysilicon have the fastest etch rate and that the various materials normally used in masking have a much lower etch rate.

| ETCH RATE A/MIN VS GAS COMPOSITION OF VARIOUS MATERIALS IN CHLORO ETCH | | | |
| --- | --- | --- | --- |
| Chloro = 500 cc Air Equivalent* $N_2$ = 300 cc Air Equivalent* | | Torr = 0.6 RF = 900 W | |
| Type of Material | No. $Cl_2$ | 25cc $Cl_2$ | 50cc $Cl_2$ |
| Silicon Substrate P-type 100 | 495 | 495 | 445 |
| P-doped ML Dep. Oxide | 35 | 60 | 44 |
| Thermal (Steam) Oxide | 25 | 25 | 25 |
| High Temp Nitride | 30 | 43 | 50 |
| Plasma Nitride | 63 | 88 | 85 |
| Poly Silicon (Undoped) | 550 | 595 | 580 |

*Fisher-Porter flow meter.

Another use of the chloro etch is the formation of silicon interconnections on semiconductor devices. After the required diffusion has been made into a semiconductor device or network and contacts made at desired regions, a layer of insulating material may be applied over the surface of the device and patterned to expose contact areas to be interconnected. A layer of silicon is then deposited on the contact areas and insulation. A photo-resist is then applied over the silicon and patterned in the desired configuration. The silicon is then etched to remove the unwanted portions to leave the desired interconnection pattern. Since the chloro etch does not undercut the resist very small interconnecting patterns may be made. This is very important in the manufacture of high density devices such as semiconductor memories, calculator devices, and microprocessors. Each of these devices have thousands of components formed in and interconnected on a single chip of semiconductor material. In order to keep the devices as small as possible, interconnecting patterns must be well defined and very close together. The use of chloro etch facilitates the manufacture of high density devices.

From the above description it may be observed that a plasma produced from a gas including $CCl_4$ can be used in etching silicon without undercutting masking materials.

While particular devices have been mentioned and particular process parameters discussed, it is to be understood that the process of the disclosed invention will be useful in manufacturing many devices and that process parameters may be modified without departing from the spirit and scope of the invention which is defined by the appended claims.

What is claimed is:

1. A process for etching silicon comprising the step of:
    contacting said silicon with a plasma derived from a gas comprising $CCl_4$, an inert gas, and a gas selected from a group consisting of $Cl_2$ and HCl.
2. A process as set forth in claim 1 wherein said inert gas is selected from a group consisting of nitrogen and argon.
3. A process as set forth in claim 2 wherein the plasma consists of $CCl_4 + N_2 + Cl_2$.
4. A process as set forth in claim 2 wherein the plasma consists of $CCl_4 + N_2 + HCl$.
5. A process for making a silicon photo-mask comprising the steps of:
    depositing a layer of silicon on a substrate; and
    patterning said silicon layer with a plasma derived from a gas comprising $CCl_4$, an inert gas, and a gas selected from a group consisting of $Cl_2$ and HCl.
6. A process as set forth in claim 5 wherein said inert gas is selected from a group consisting of nitrogen and argon.
7. A process as set forth in claim 6 wherein the plasma consists of $CCl_4 + N_2 + Cl_2$.
8. A process as set forth in claim 6 wherein the plasma consists of $CCl_4 + N_2 + HCl$.
9. A process for manufacturing a high density semiconductor device having a plurality of components formed thereon and interconnected by very small silicon interconnecting patterns comprising the steps of:
    depositing a layer of insulating material over the surface of said semiconductor device;
    patterning said layer of insulating material to expose contact areas to be interconnected;
    depositing a layer of silicon on said contact areas and said layer of insulating material; and
    etching said layer of silicon with a plasma derived from a gas comprising $CCl_4$, an inert gas, and a gas selected from a group consisting of $Cl_2$ and HCl so as to remove unwanted portions of said layer of silicon to leave the desired silicon interconnection patterns.
10. A process as set forth in claim 9 wherein the plasma consists of $CCl_4 + N_2 + Cl_2$.
11. A process as set forth in claim 9 wherein the plasma consists of $CCl_4 + N_2 + HCl$.

* * * * *